(12) United States Patent
Wohl et al.

(10) Patent No.: US 6,950,974 B1
(45) Date of Patent: Sep. 27, 2005

(54) EFFICIENT COMPRESSION AND APPLICATION OF DETERMINISTIC PATTERNS IN A LOGIC BIST ARCHITECTURE

(75) Inventors: Peter Wohl, Williston, VT (US); John A. Waicukauski, Tualatin, OR (US); Thomas W. Williams, Boulder, CO (US)

(73) Assignee: Synopsys Inc., Mountain View, CA (US)

( * ) Notice: Subject to any disclaimer, the term of this patent is extended or adjusted under 35 U.S.C. 154(b) by 494 days.

(21) Appl. No.: 09/950,292

(22) Filed: Sep. 7, 2001

(51) Int. Cl.[7] ............................................. G01R 31/28
(52) U.S. Cl. .................................... 714/733; 714/728
(58) Field of Search ................................. 714/726, 729, 714/722, 733, 727, 724; 455/260

(56) References Cited

U.S. PATENT DOCUMENTS

| | | | | |
|---|---|---|---|---|
| 6,148,425 A | * | 11/2000 | Bhawmik et al. | ........... 714/726 |
| 6,463,561 B1 | * | 10/2002 | Bhawmik et al. | ........... 714/733 |
| 6,480,980 B2 | * | 11/2002 | Koe | ........... 714/738 |
| 2002/0009983 A1 | * | 1/2002 | Pritchett et al. | ............. 455/260 |

OTHER PUBLICATIONS

"LFSR-Coded Test Patterns for Scan Designs" by Dr. Bernd Könemann; 6 pgs.

"Logic DFT and Test Resource Partitioning for 100M Gate ASICs Part I: Current Chip-Level DFT Methology Overview" by Bernd Könemann et al.; pp. 1-4.

"Logic DFT and Test Resource Partitioning for 100M Gate ASICs Part II: LBIST Overview" by Bernd Könemann et al.; pp. 1-5.

"Logic DFT and Test Resource Partitioning for 100M Gate ASICs Part III: SmartBIST™ Roadmap" Bernd Könemann et al.; pp. 1-5.

"A Pattern Skipping Method for Weighted Random Pattern Testing" by Bernd Könemann; pp. 418-425.

* cited by examiner

*Primary Examiner*—Albert Decady
*Assistant Examiner*—James C Kerveros
(74) *Attorney, Agent, or Firm*—Bever, Hoffman & Harms, LLP; Jeanette S. Harms (57) ABSTRACT

Deterministic ATPG test coverage is provided in a logic BIST architecture while reducing test application time and test data volume, as compared to deterministic ATPG patterns. The logic BIST architecture can include a PRPG shadow operatively coupled to a PRPG circuit. The PRPG shadow allows re-seeding of the PRPG circuit with zero cycle overhead. Two compressions can be provided. In a first compression, multiple tests for faults are compressed into one pattern. In a second compression, multiple deterministic ATPG patterns can be compressed into one seed. All patterns provided from the PRPG can be controlled by these seeds so that all care bits are properly set, while all other scan cells are set to pseudo-random values from the PRPG. In this manner, the PRPG can rapidly deliver highly pertinent data to the scan chains of the device under test.

30 Claims, 8 Drawing Sheets

EFFICIENT COMPRESSION AND APPLICATION OF DETERMINISTIC PATTERNS IN A LOGIC BIST ARCHITECTURE

BACKGROUND OF THE INVENTION

1. Field of the Invention

The embodiments of the present invention relate to a built-in self test (BIST) architecture, and particularly to compressing and applying deterministic automatic test pattern generation (ATPG) patterns in a logic BIST architecture.

2. Description of the Related Art

Larger and more complex logic designs in integrated circuits (ICs) lead to demands for more sophisticated testing to ensure fault-free performance of those ICs. This testing can represent a significant portion of the design, manufacture, and service cost of integrated circuits (ICs). In a simple model, testing of an IC can include applying multiple test patterns to the inputs of a circuit and monitoring its outputs to detect the occurrence of faults. Fault coverage indicates the efficacy of the test patterns in detecting each fault in a universe of potential faults. Thus, if a set of test patterns is able to detect substantially every potential fault, then fault coverage approaching 100% has been achieved.

To facilitate better fault coverage and minimize test cost, DFT (design-for-test) can be used. In one DFT technique, structures in the logic design can be used. Specifically, a logic design implemented in the IC generally includes a plurality of state elements, e.g. sequential storage elements like flip-flops. These state elements can be connected into scan chains of computed lengths, which vary based on the design. In one embodiment, all state elements in a design are scannable, i.e. each state element is in a scan chain. The state elements in the scan chains are typically called scan cells. In DFT, each scan chain includes a scan-input pin and a scan-output pin, which serve as control and observation nodes during the test mode.

The scan chains are loaded by clocking in predetermined logic signals through the scan cells. Thus, if each scan chain includes 500 scan cells, then 500 clock cycles are used to complete the loading process. Note that, for simplicity, the embodiments provided herein describe scan chains of equal length. In actual embodiments, DFT attempts to create, but infrequently achieves, this goal. Thus, in actual embodiments, software can compensate for the different scan chain lengths, thereby ensuring that outputs from each test pattern are recognized and analyzed accordingly. This methodology is known by those skilled in the art and therefore is not explained in detail herein.

The test patterns for the scan chains can be generated using an external testing device. Using such a device, an exhaustive test can be done by applying 2N input patterns to a design with N inputs and scan cells. However, this test approach rapidly becomes commercially impractical as the number of inputs increases.

To solve this problem, deterministic automatic test pattern generation (ATPG) can be used to generate the minimum set of patterns while providing fault coverage close to 100%. Specifically, in deterministic ATPG, each test pattern is designed to test for the maximum number of faults. However, even with the reduction in test patterns, deterministic ATPG patterns still require significant storage area in the test-application equipment (tester) for the large number of patterns that are input directly to the scan chains, and for the expected output values from the scan chains. Moreover, this test method has associated inefficiencies because of its off-chip access time.

Alternatively, and more frequently in current, complex ICs, structures can be added to the design that allow the IC to quickly test itself. These built-in self-test (BIST) structures can include various pattern generators, the most typical being a pseudorandom pattern generator (PRPG). After the patterns generated by the PRPG are propagated through the scan chains in the tested design, the outputs are analyzed to determine if a fault is detected.

Figure 1A:
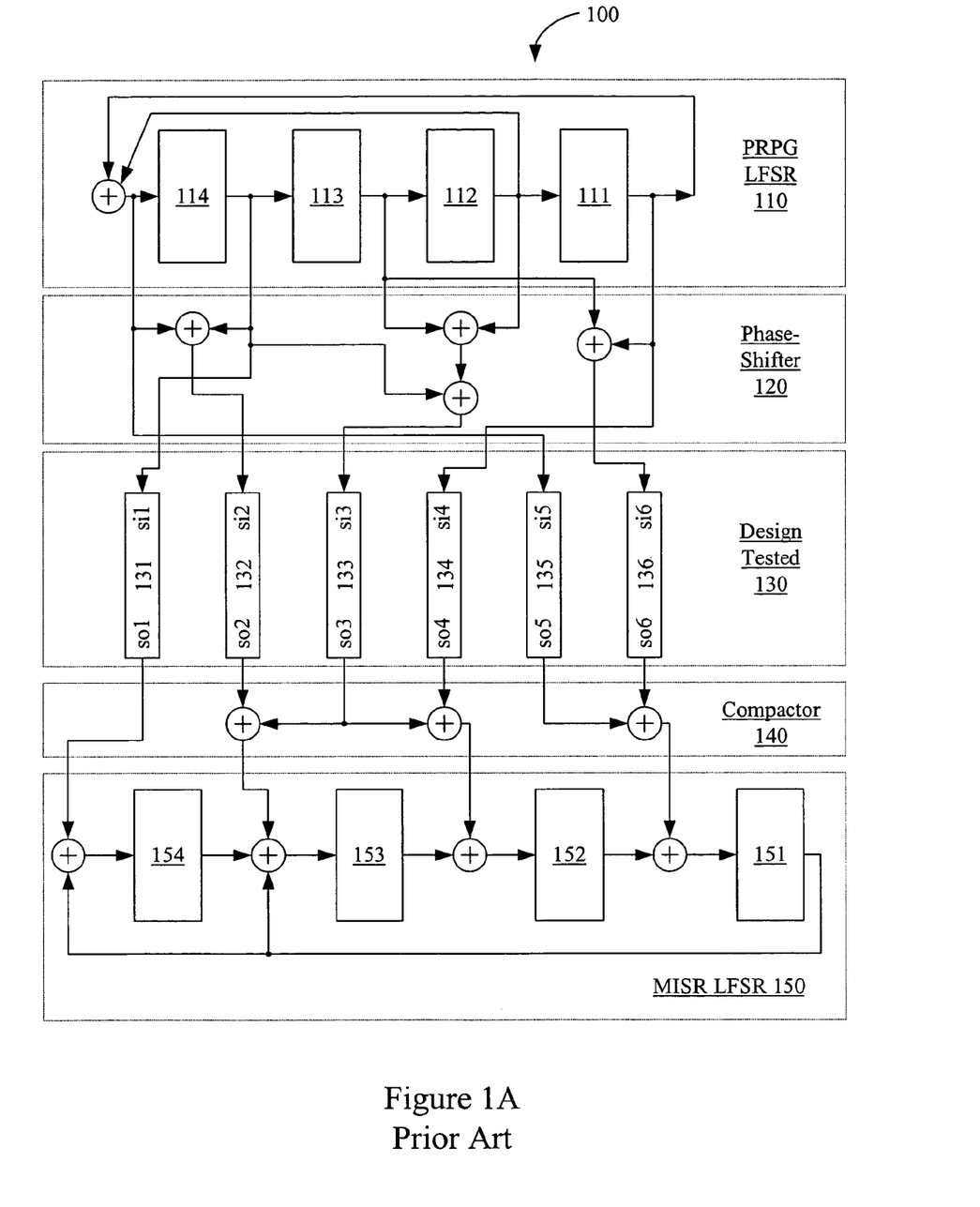
FIG. 1A illustrates a built-in self-test architecture for providing pseudorandom pattern generation.

FIG. 1A illustrates a logic BIST architecture 100 for testing a design 130 having six scan chains 131–136. In this embodiment, architecture 100 includes a linear feedback shift register (LFSR) 110 to implement the PRPG. PRPG-LFSR 110 includes a plurality of sequential storage elements (in a typical embodiment, flip-flops) 111–114 that are connected in series with a feedback loop and one XOR operation (indicated by the circled plus sign). As shown in FIG. 1A, the flow of signals in these interconnected flip-flops is from left to right. Note that a linear feedback shift register has a characteristic polynomial that is expressed in terms of its feedback connections. In this embodiment, PRPG-LFSR 110 implements the polynomial $f(x)=x^4+x^3+1$. Other embodiments can implement other polynomials, preferably primitive polynomials.

Figure 1B:
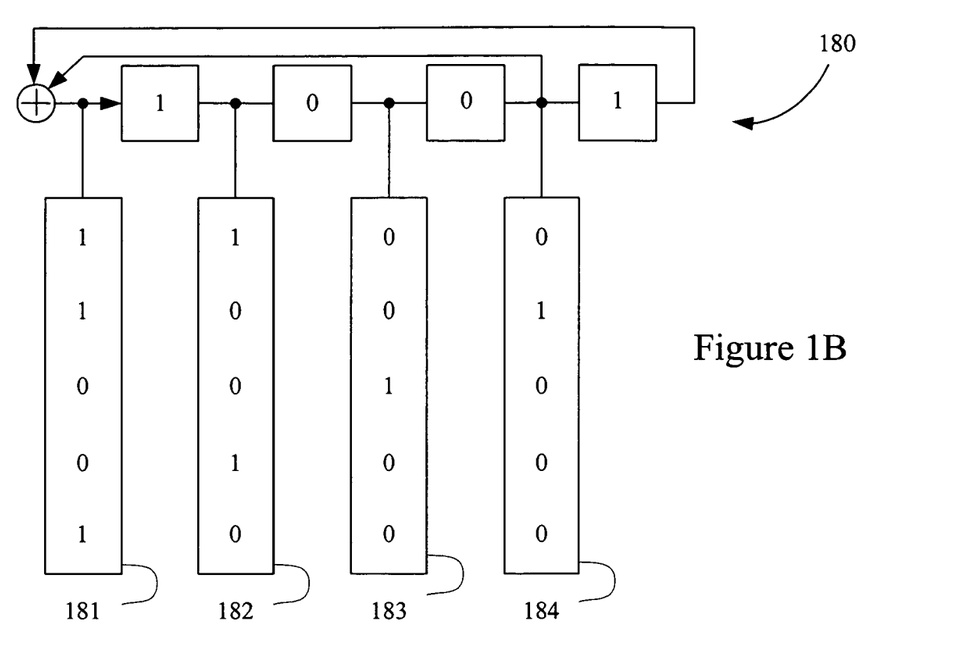
FIG. 1B illustrates an LFSR generating bit sequences for a plurality of scan chains.

As shown in FIG. 1B, if an LFSR 180 generates bit sequences, i.e. the test patterns, directly for scan chains 181–184, then those bit sequences differ by only a few bits, i.e. phase shifts. These small phase shifts can undesirably reduce the fault coverage. As a result, in architecture 100, a phase shifter 120 is provided to transform the outputs of PRPG-LFSR 110 into uncorrelated signals. Phase shifter 120 is described in further detail in "Built-In Test for VLSI: Pseudorandom Techniques", by P. H. Bardell et al., page 176, John Wiley & Sons, 1987. Thus, the values from PRPG-LFSR 110 are loaded into scan chains 131–136 in a manner controlled by the various XOR operations in phase shifter 120. In this embodiment, scan chain 131 includes an input scan pin si1 and an output scan pin so1. Scan chains 132–136 include corresponding scan pins si2/so2, si3/so3, si4/so4, si5/so5, and si6/so6, respectively.

Compactor 140 compacts the outputs from tested design 130 and provides inputs to a multiple input signature register (MISR) LFSR 150, which includes a plurality of storage elements 151–154 coupled in series with various XOR operations and feedback loops. In this embodiment, MISR-LFSR 150 implements the polynomial $f(x)=x^4+x+1$. After several cycles, MISR-LFSR 150, described in further detail in "Built-In Test for VLSI: Pseudorandom Techniques", by P. H. Bardell et al., page 119, John Wiley & Sons, 1987, provides a "signature" that is a near-unique checksum for a given sequence of its input values. At this point, the state of MISR-LFSR 150 can be compared to the known "signature" of the fault-free design, wherein a mismatch indicates that at least one erroneous value was unloaded from scan chains 131–136. This erroneous value can be used to determine that a fault exists in tested design 130.

Figure 1C:
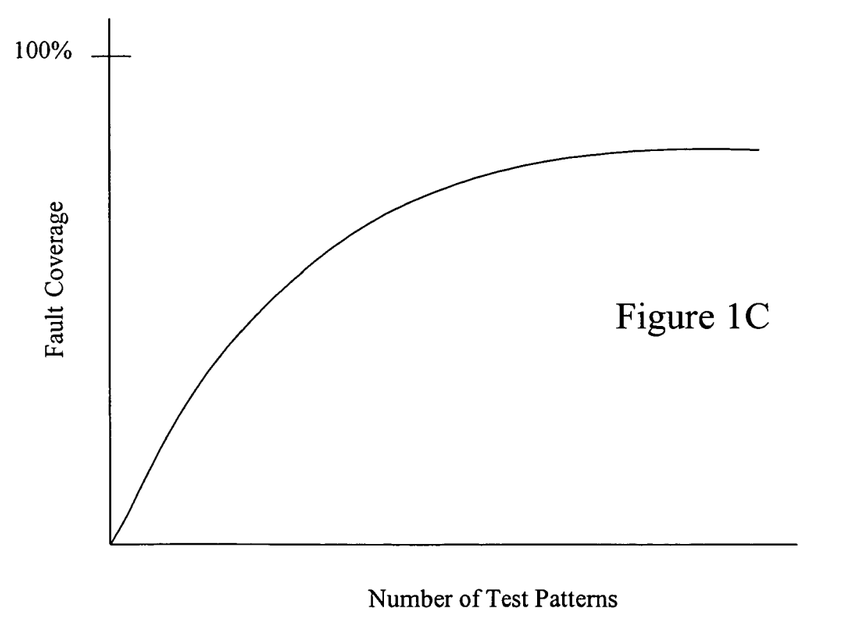
FIG. 1C illustrates a graph plotting fault coverage versus number of test patterns.

FIG. 1C illustrates a graph plotting fault coverage versus number of pseudorandom test patterns. As seen in FIG. 1C, pseudorandom pattern generation has two disadvantages. First, the final fault coverage is signficantly less than 100%. Generally, a PRPG provides fault coverage in the range of 70–80%, which is unacceptable for many IC applications. Moreover, as the number of test patterns increases, the detection of faults becomes significantly less efficient. Specifically, pseudorandom pattern generation is very efficient in removing easy-to-detect faults from a fault list in the beginning of the test process, but is less efficient in removing hard-to-detect (i.e. circuit dependent) faults near the end of the test process. In fact, to achieve acceptable test coverage, the number of PRPG patterns must be significantly larger than the number of deterministic ATPG patterns to provide the same fault coverage. Therefore, using PRPG forces a trade-off between reduced test coverage and reduced tester storage data.

Several solutions have been proposed to address this problem, each having associated disadvantages. In one solution, the number of scan chains can be increased, thereby reducing the number of pattern load/unload clock cycles. However, the tester storage volume is still unreasonably large for typical industry applications. In a second solution, test points can be added to the design, thereby increasing the probability of fault detection by pseudorandom patterns. This solution is undesirable because it increases silicon area and the propagation delay of critical timing paths. In a third solution, the pseudorandom patterns can be biased or modified to test for random-resistant faults. However, this solution adds significant silicon area to the design and/or increases data volume stored in the tester. In a fourth solution, deterministic ATPG patterns can be added to BIST patterns for a more complete test coverage. However, this solution significantly increases the data volume stored in the tester.

Finally, in a fifth solution, the PRPG is initialized, i.e. seeded, such that predetermined scan cells are set to values, after a suitable number of cycles of the PRPG, that achieve detection of targeted faults. The values stored in these predetermined scan cells, called "care bits", are typically much fewer (i.e. on the order of hundreds) than the "don't care bits" (i.e. on the order of hundreds of thousands) stored in the other scan cells. This solution is described in further detail in "LFSR-Coded Test Patterns for Scan Designs", by B. Könemann, Munich 1991. Although improving test coverage, this solution requires storing a significant number of seeds for the PRPG to detect the care bits, thereby undesirably increasing the amount of stored data. Additionally, this solution requires serially loading the seeds into the PRPG. In FIG. 1A, four clock cycles are needed to load PRPG-LFSR 110. However, an actual implementation of PRPG-LFSR 110 could include hundreds of storage elements, thereby requiring a corresponding number of cycles to load. Thus, this solution can also significantly increase the test application time. Therefore, a need arises for a pseudorandom pattern generation system and method that minimizes test application time while achieving fault coverage comparable to deterministic ATPG.

SUMMARY OF THE INVENTION

The embodiments of the present invention provide deterministic ATPG test coverage in a logic built-in self-test (BIST) architecture. This BIST architecture provides re-seeding of a pseudorandom pattern generator (PRPG) with zero cycle overhead (assuming that the number of scan bits loaded in a scan chain is greater than the length of the PRPG), thereby significantly reducing test cycle count compared to deterministic ATPG patterns. In the present invention, a seed generates multiple patterns, wherein each pattern sets predetermined "care bits", i.e. scan cells that must be set to a certain value. In this methodology, the scan cells not storing care bits are set to pseudo-random values from the PRPG circuit.

In accordance with one feature of the present invention, pattern generation can target as many faults as possible in a single pattern while ensuring that the care bits have compatible values. To improve test application time, the number of scan cells for one pattern, cells-per-pattern, can be selected, thereby providing a high probability that a seed exists to set the necessary care bits.

In one embodiment, test pattern generation continues computing other patterns in the same fashion, until the total number of scan cells set for all patterns reaches a second selectable limit, total_cells, or the number of patterns reaches its limit, pats_per_set. In this manner, even if the first pattern utilizes all cells_per_pattern cells, enough cells are left (total_cells-cells_per_pattern) to create at least one more pattern.

Therefore, the method of the embodiments of the present invention reduces total data volume by storing a minimal number of seeds, which in turn generate multiple, useful patterns. This advanced utilization of each seed is particularly advantageous towards the tail end of a pattern set. Moreover, computing a seed for any number of patterns seamlessly adapts to all types of faults encountered. Specifically, some faults require a large number of scan cells at certain values. Thus, the test pattern of the embodiments of the present invention could take up a large portion of one seed. Other faults can be tested by patterns that share a large number of common scan cell values. The test pattern generation of the embodiments of the present invention can exploit this commonality by creating a single pattern to test all these faults. Yet other faults can only be tested by patterns that set a few scan cells, but their values are incompatible with testing most other faults. The computed seed of the embodiments of the present invention includes multiple patterns, each pattern optimized for maximum fault detection. Typically, a design includes many faults that fall between the above types. Advantageously, irrespective of the type of fault, the method of the embodiments of the present invention computes seeds to obtain the best possible compression of the test patterns.

In accordance with one feature of the present invention, a built-in self-test (BIST) system for testing a design including a plurality of scan chains is provided. The system can include a plurality of pseudorandom pattern generator (PRPG) shadow registers (collectively referred to as the PRPG shadow) and a PRPG circuit. Each PRPG shadow register can include a plurality of first storage elements serially coupled. The PRPG circuit can include a plurality of second storage elements operatively coupled, wherein each second storage element selectively receives a value of a corresponding first storage element, a value of another second storage element, or a value of a logic function. The PRPG circuit generates a bit sequence for each of the scan chains. The system can further include a signature generator circuit coupled to receive output signals from the scan chains and generate a signature from those output signals.

In one embodiment, the total number of first storage elements in the PRPG shadow is equal to the number of second storage elements. Additionally, the total number of first storage elements in each register of the PRPG shadow is less than or equal to the total number of scan cells in each scan chain.

In one embodiment, a first clock associated with the PRPG shadow and a second clock associated with the PRPG circuit are pulsed at the same time. Alternatively, or in the same embodiment, the second clock associated with the PRPG circuit and a third clock associated with the plurality of scan chains are pulsed at the same time.

The PRPG circuit can further include a plurality of multiplexers, wherein each multiplexer receives a signal from a corresponding first storage element and provides a signal to a corresponding second storage element. Advantageously, the multiplexers can be set to transfer signals from the corresponding first storage elements using a single control signal. In one embodiment, the PRPG circuit includes a linear feedback shift register (LFSR). In another embodiment, the PRPG circuit includes a cellular automata.

The BIST system can also include a phase-shifter coupled between the PRPG circuit and the plurality of scan chains. In one embodiment, the signature generator circuit can include a multiple input signature register (MISR), which can be implemented as a linear feedback shift register. The BIST system can also include a compactor coupled between the plurality of scan chains and the MISR.

In accordance with another feature of the present invention, a system for testing a design implemented in an integrated circuit (IC) is provided. The design typically includes a plurality of scan chains generated as a result of design-for-test (DFT) techniques. The system includes a set of shadow registers to the PRPG register, wherein each shadow register includes a plurality of storage elements serially coupled. The system can also include means for generating a pseudorandom pattern from values stored in the plurality of storage elements, wherein the pseudorandom pattern can be provided to the plurality of scan chains. Additionally, the system can include means for providing a signature from the output signals of the scan chains.

Of importance, each storage element in the shadow register has an associated storage element in the means for generating pseudorandom patterns. Moreover, the total number of storage elements in each shadow register must be less than or equal to the total number of scan cells in each scan chain. In one embodiment, the means for generating pseudorandom patterns includes a plurality of switching devices, wherein each switching device receives a signal from a corresponding storage element in the shadow register and provides a signal to a corresponding associated storage element in the means for generating pseudorandom patterns.

In accordance with another feature of the present invention, a pseudorandom pattern generator (PRPG) unit for testing a design including a plurality of scan chains is provided. The PRPG unit can include a PRPG shadow and a PRPG circuit. The PRPG shadow can include a plurality of registers, wherein each register includes a plurality of first storage elements serially coupled. The PRPG circuit can including a plurality of second storage elements operatively coupled, wherein each second storage element selectively receives a value of a corresponding first storage element, a value of another second storage element, or a value of a logic function. The PRPG circuit generates a bit sequence for each of the scan chains.

The total number of first storage elements in the PRPG shadow is equal to the total number of second storage elements in the PRPG circuit. To ensure that test application time is effectively used, the number of first storage elements in each register of the PRPG shadow is less than or equal to the total number of scan cells in each scan chain.

The PRPG circuit can further include a plurality of multiplexers, wherein each multiplexer receives a signal from a corresponding first storage element and provides a signal to a corresponding second storage element. The multiplexers can be advantageously set to transfer signals from the corresponding first storage elements using one control signal.

In one embodiment, a first clock associated with the PRPG shadow, a second clock associated with the PRPG circuit, and a third clock associated with the plurality of scan chains are pulsed at the same time, thereby ensuring that the PRPG shadow is fully loaded by the time the scan chains have propagated a pattern. In this manner, the PRPG shadow can re-seed the PRPG circuit with no cycle overhead.

In accordance with another feature of the present invention, a method of providing seeds for a pseudorandom pattern generator for detecting or testing faults in a design is provided. The method can include creating a list of faults, starting a new set of patterns, adding patterns to the new set, computing a seed for the patterns in the new set, and repeating these steps until all faults are tested. The step of adding patterns to the new set can include starting a new pattern with no care bits set in the design, adding at least one test to the new pattern, wherein the test sets at least one care bit, and determining if any untested faults remain (first occurrence).

If no untested faults remain, then the method can proceed to the step of computing the seed. However, if untested faults remain, then the method can determine if a total number of care bits set is less than a maximum number of scan cells that can be set for a single seed.

If a total number of care bits set is not less than the maximum number of scan cells that can be set for a single seed, then the method can proceed to compute the seed. However, if the total number of care bits is less than the maximum number of scan cells that can be set for a single seed, then the method can determine if a total number of patterns is less than a predetermined number of patterns per set.

If the total number of patterns is not less than the predetermined number of patterns per set, then the method can proceed to compute the seed. However, if the total number of patterns is less than the predetermined number of patterns per set, then the method can return to the step of starting a new pattern.

The step of adding at least one test to the pattern can include selecting a new untested fault, generating a test for the selected fault, within limits, wherein the test is compatible with all care bits set in the new pattern. In one embodiment, "within limits" can include at least one of a computational impossibility and a time limitation. If the test is not successful, i.e. within limits, then the method can proceed to a step of determining if any untested fault remains (second occurrence). If the test is successful, then the method can include determining if the number of care bits set is less than a predetermined number of scan cells per pattern.

If the number of care bits set is not less than a predetermined number of scan cells per pattern, then the method can remove the last test from the current pattern and proceed to the step of determining if more untested faults are present (first occurrence). However, if the number of care bits set is less than a predetermined number of scan cells per pattern, then the method can mark the new untested fault as tested. At this point, the method can determine if another untested fault is present (second occurrence). If another untested fault is present, then the method can include returning to the step of selecting the next untested fault. However, if another untested fault is not present, then the method can proceed to the step of determining if more untested faults are present (first occurrence).

In accordance with another feature of the present invention, a method of testing an integrated circuit (IC) is provided. The method can include providing a plurality of scan chains in a design for the IC, and computing a plurality of seeds. Each seed can generate a plurality of patterns for propagating through the plurality of scan chains. Moreover, each pattern can test for at least one fault in the design.

In accordance with another feature of the present invention, a method of providing a seed for a built-in self-test architecture for testing a design is provided. The method can include providing a first compression of a number of faults to be tested in a pattern and providing a second compression of a plurality of patterns into the seed. Typically, testing a fault requires a plurality of care bits. In this case, the first compression can include generating a test for a selected fault, wherein the test sets a predetermined number of care bits, and determining if the test is compatible with the care bits set in a selected pattern. The first compression can further include determining if a total number of set care bits is less than a predetermined number of scan cells per pattern. In this manner, the embodiments of the present invention can ensure a time-efficient test generation for each pattern. The second compression can include determining if a total number of care bits set is less than a predetermined number of scan cells in the design. The second compression can further include determining if a total number of patterns is less than a predetermined number of patterns per seed. In one embodiment, the total number of scan cells is set to be approximately the size of the PRPG circuit minus ten. In one embodiment, the predetermined number of scan cells per pattern can be set to be approximately 10%–20% less than the total number of scan cells. In this manner, even if a first pattern utilizes all the predetermined number of scan cells, enough cells are left to create at least one more pattern.

In one embodiment, a program storage device, readable by a machine, tangibly embodies a program of instructions executable by said machine to perform method steps in testing an integrated circuit (IC) design. The method steps can include any of the three sets of steps described above or any combination of these steps.

In accordance with another feature of the present invention, a computer program product includes a computer usable medium having a computer readable program code embodied therein for causing a computer to compute multiple seeds for a pseudorandom pattern generator. The computer readable program code can include computer readable program code that computes multiple tests for each pattern, wherein each test detects a fault associated with an integrated circuit (IC) design, as well as computer readable program code that computes multiple patterns for each seed. The computer readable program code can further include computer readable program code that determines if a total number of care bits set in the IC design is less than a predetermined number of scan cells in the design. The computer readable program code can further include computer readable program code that determines if a total number of patterns is less than a predetermined number of patterns per seed. The computer readable program code can further include computer readable program code that generates a test for a selected fault, wherein the test sets a predetermined number of care bits, as well as computer readable program code that determines if the test is compatible with the care bits set in a selected pattern. Finally, the computer readable program code can further include computer readable program code that determines if a total number of set care bits is less than a predetermined number of scan cells per pattern.

DETAILED DESCRIPTION OF THE DRAWINGS

In accordance with one feature of the present invention, a logic BIST architecture includes a PRPG shadow that eliminates the cycle overhead associated with re-seeding of the PRPG-LFSR. In accordance with another feature of the present invention, two compressions are performed. In a first compression, a pattern for multiple fault detection is generated. In a second compression, a seed based on multiple patterns is generated. By using these two compressions, the embodiments of the present invention dramatically reduce the data volume associated with the seeds of the PRPG-LFSR. The embodiments of the present invention can advantageously apply deterministic ATPG patterns in a logic BIST architecture.

PRPG Shadow Registers Reduce Test Application Time

Figure 2A:
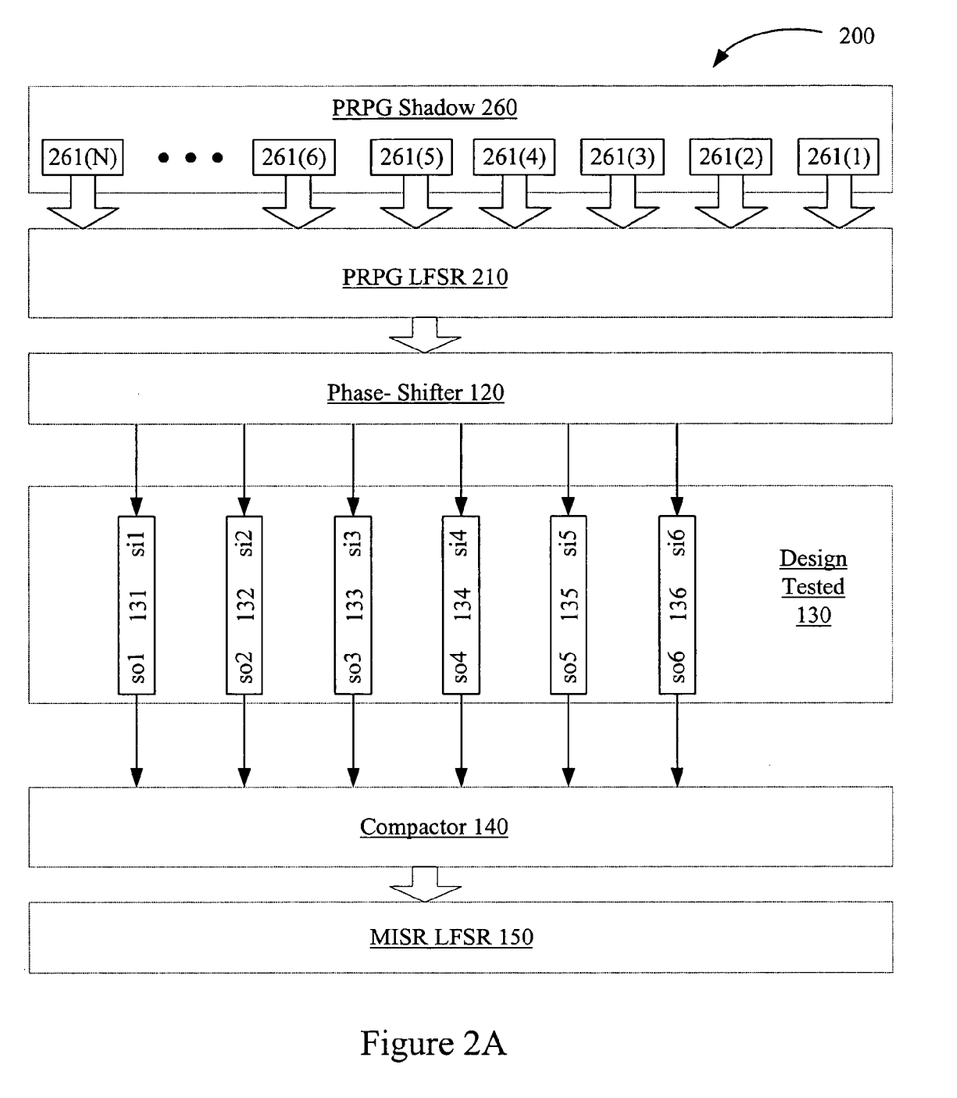
FIG. 2A illustrates a built-in self-test architecture including a PRPG shadow for seeding a PRPG-LFSR in accordance with the present invention.

FIG. 2A illustrates a logic BIST architecture 200 in which a PRPG-LFSR 210 selectively receives signals from a PRPG shadow 260. PRPG shadow 260 includes N PRPG shadow registers 261, wherein each shadow register includes M serially coupled storage elements (not shown, but explained in further detail in reference to FIG. 2B) (wherein both N and M are integers greater than 2). Of importance, the total number of storage elements in PRPG shadow registers 261, i.e. N×M storage elements, is equal to the number of storage elements in PRPG-LFSR 210. In accordance with one feature of the present invention, PRPG shadow registers 261 are loaded in parallel. Thus, the number of clock cycles to load these shadow registers is equal to the number of storage elements in each shadow register, i.e. M.

To determine the values of N and M, the number of care bits to be set as well as the longest length of the scan chains of tested design 130, i.e. scan chains 131–136, should be considered. Applicants have determined that the length of PRPG-LFSR 210 (N×M) minus 10 approximately equals the maximum number of care bits that may be set for a single seed, which may be used for a plurality of patterns. Applicants have further determined that during the last stages of testing approximately 240 care bits may be needed to be set within a single pattern. Therefore, in one embodiment, 256 storage elements are provided in PRPG-LFSR 210 (wherein 256−10>240). Thus, because the total number of storage elements in PRPG shadow 260 is equal to the number of storage elements in PRPG-LFSR 210, N×M should be equal to 256.

In one embodiment, each scan chain 131–136 includes 32 scan cells, thereby requiring 32 clock cycles to provide outputs from the seed provided by PRPG-LFSR 210 (via phase shifter 120). Note that other embodiments can include more or less scan cells per scan chain. In accordance with one feature of the present invention, PRPG shadow 260 can be fully loaded in the number of clock cycles it takes to load scan chains 131–136 (in this embodiment, 32 clock cycles). To provide this loading characteristic, the number (M) of storage elements in each PRPG shadow register 261 can be set to 32. Therefore, in this embodiment, 8 PRPG shadow registers 261 can be provided in PRPG shadow 260 (256÷32=8=N).

Figure 2B:
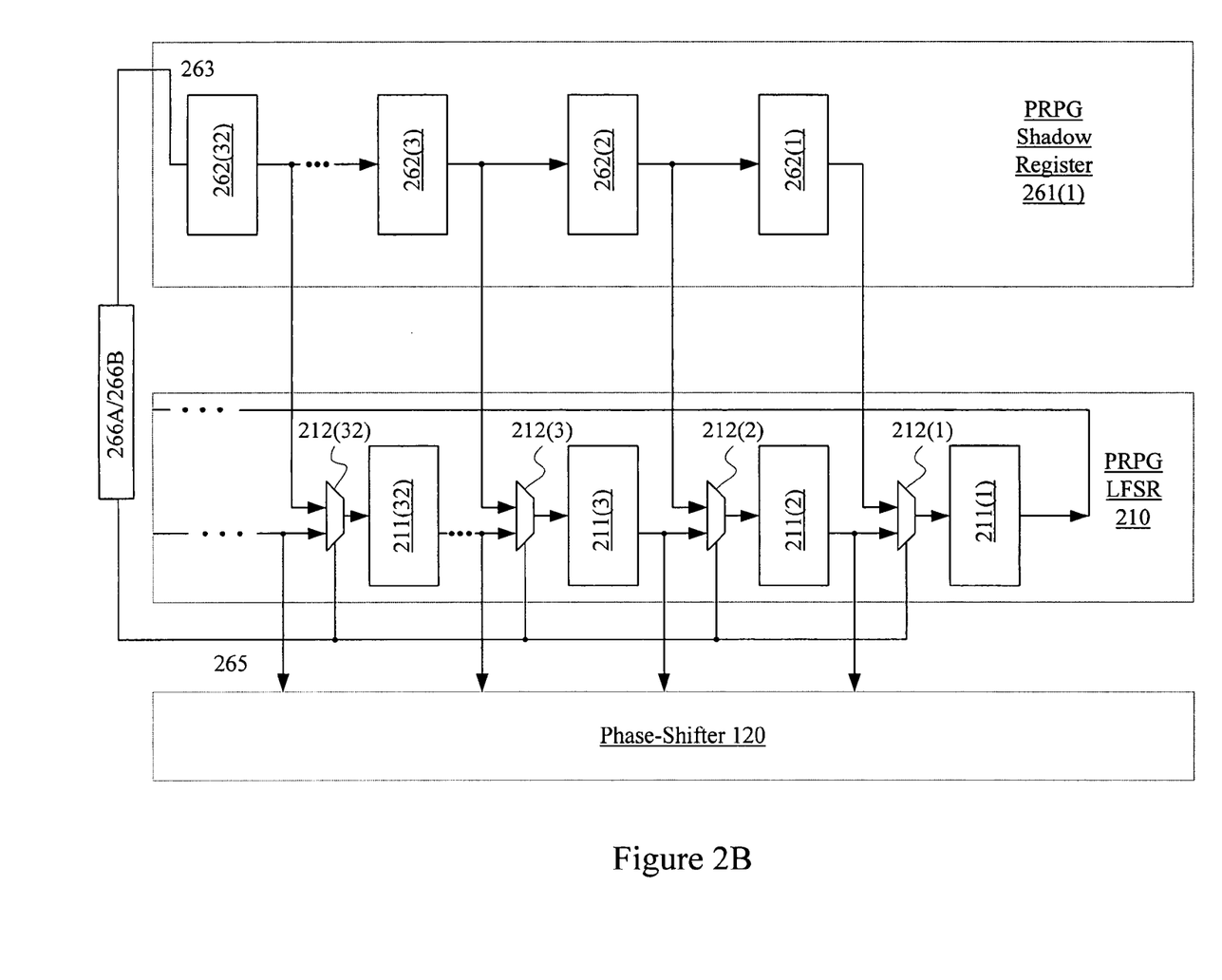
FIG. 2B illustrates one embodiment of a shadow register of the PRPG register and a portion of the PRPG-LFSR of the present invention.

FIG. 2B illustrates a PRPG shadow register 261(1) and a portion of PRPG-LFSR 210 in greater detail. In the above-described embodiment, PRPG-LFSR 210 includes 256 storage elements 211. In FIG. 2B, for simplicity, only 32 storage elements (in one embodiment, flip-flops) 211 are indicated. PRPG-LFSR 210 further includes a plurality of multiplexers 212, wherein each multiplexer 212 provides an output signal to an input terminal of an associated storage element 211. Thus, 256 multiplexers 212 can be provided in one embodiment of PRPG-LFSR 210. Note that PRPG-LFSR 210 can include various feedback loops to implement desired polynomials. However, in FIG. 2B, once again for simplicity, only one feedback loop coupled to the output of storage element 211(1) is shown.

As one advantage of the present invention, by using multiplexers 212, PRPG-LFSR 210 can function as a standard pseudorandom pattern generator, i.e. provide pseudo-random patterns by propagating bits in storage elements 211, or receive new seeds from PRPG shadow register 261(1). In PRPG shadow register 261(1), storage elements 262(1)–262(32) can be loaded using a scan-in line 263. These storage elements 262(1)–262(32) can then provide output signals to multiplexers 212(1)–212(32), respectively, of PRPG-LFSR 210. Note that PRPG shadow registers 261(2)–261(8) have a similar configuration to PRPG shadow register 261(1) and therefore are not explained in detail herein. PRPG shadow registers 261(1)–261(8) are referred to collectively as PRPG shadow registers 261.

In accordance with one feature of the present invention, a segment of a seed is loaded into each of PRPG shadow registers 261. Thus, by loading PRPG shadow registers 261 in parallel, PRPG shadow 260 can provide a new seed to PRPG-LFSR 210 in only M clock cycles (in this embodiment, 32 clock cycles). Note that in the prior art, such as that described by B. Könemann in 1991, new seeds can be loaded in parallel. However, the re-seeding and scan chain loading are done serially. Therefore, in the preferred implementation described by Könemann including a 256 PRPG, 16 scan-in pins, and scan chains of length 300, a total of 316 scan clock cycles are necessary. In contrast, and described in further detail below, PRPG shadow registers 261, PRPG-LFSR 210, and the scan chains can be loaded in parallel, thereby dramatically reducing the overhead associated with the Könemann PRPG.

In accordance with one feature of the present invention, all multiplexers 212 in PRPG-LFSR 210 can be controlled by a single control signal provided on transfer line 265. In one embodiment, an external tester 266A can provide the seed segment to scan-in line 263 of PRPG shadow register 261(1) as well as the control signal to transfer line 265. In another embodiment, an on-chip controller 266B can provide the control signal to transfer line 265 and trigger a memory access to provide the appropriate seed segment to scan-in line 263. The memory could include any standard non-volatile memory cell array, thereby allowing the IC to conduct a self-test without external assistance.

In accordance with one feature of the present invention, the new seed that is loaded into PRPG shadow 260 can be advantageously transferred at any time to PRPG-LFSR 210. Specifically, to use a first seed for multiple patterns, the transfer of a second seed stored in PRPG shadow registers 261 into PRPG-LFSR 210 is simply delayed until the first seed has been used for the desired number of patterns. For example, assume that the clocks of storage elements 211 in PRPG-LFSR 210, storage elements 262 in PRPG shadow register 260, and the scan cells in scan chains 131–136 are pulsed at the same time. In this embodiment, the on-chip controller could include a 32-bit counter, which provides the control signal on transfer line 265 after every 32 clock cycles. In this manner, PRPG-LFSR 210 would generate 32 patterns from every seed introduced by PRPG shadow registers 261.

In other words, by using multiplexers 212, a new seed can be advantageously provided for every X patterns, wherein X is an integer greater than or equal to one. In this manner, the embodiments of the present invention allow full overlap of three seeds in different stages. Specifically, a seed i provided in PRPG-LFSR 210 can be loaded into scan chains 131–136, a seed i+1 (i.e. a subsequent seed to seed i) can be loaded into PRPG shadow 260, and captured values in scan cells s01–s06 generated by a seed i−1 (i.e. a previous seed to seed i) can be unloaded from scan chains 131–136. Thus, seeds i, i+1, and i−1 can all be processed simultaneously by architecture 200. A system can easily implement this fully optimized architecture with minimal silicon overhead on any integrated circuit.

Compression of Deterministic ATPG Patterns Reduces Data Storage and Test Application Time In test pattern generation, although the first few patterns detect the majority of the faults, considerably more patterns are needed to detect the remaining faults. Often, over 50% of the total number of patterns are generated to test these remaining faults. Detection of each of these remaining hard-to-detect faults could require setting a predetermined number of the scan cells (e.g. in the range of 30–60) in the scan chains to particular values, which is very unlikely to occur in random pattern generation. For this reason, it is desirable to supplement pseudorandom pattern generation with deterministic ATPG.

However, because the conditions required to test each of the hard-to-detect faults can be mutually incompatible (e.g. setting a scan cell to different logic values), a single ATPG pattern can typically only test a limited number of these faults. In fact, it is not uncommon for one ATPG pattern to be provided for only one or a few (e.g. less than 10) hard-to-detect faults. Because each prior art ATPG pattern would function as a separate seed in architecture 200, most of the bits in the seed could remain unused. For example, as noted above, a 256-bit LFSR seed can set about 240 scan cells to desired values. If an ATPG pattern generated for testing a hard-to-detect fault requires that 40 scan cells be set to specific values, then 200 bits would be left unused in the seed. Therefore, during testing of hard-to-detect faults, standard ATPG wastes many bits in the seed.

In accordance with one feature of the present invention, these previously wasted bits can be advantageously used to satisfy the required scan cell values for additional patterns.

Specifically, multiple ATPG patterns can be very tightly compressed into one seed, thereby significantly increasing the bit utilization for the seed. This feature is particularly desirable for the large number of patterns that previously could detect only a few faults each.

Note that using a large PRPG-LFSR, i.e. over 200 storage elements, ensures that faults requiring a large number of scan cells to be set can be tested. Of importance, the double compression technique of the present invention, i.e. testing for multiple faults per pattern, if possible, and providing multiple patterns per seed, allows full utilization of the PRPG-LFSR.

Figure 3A:
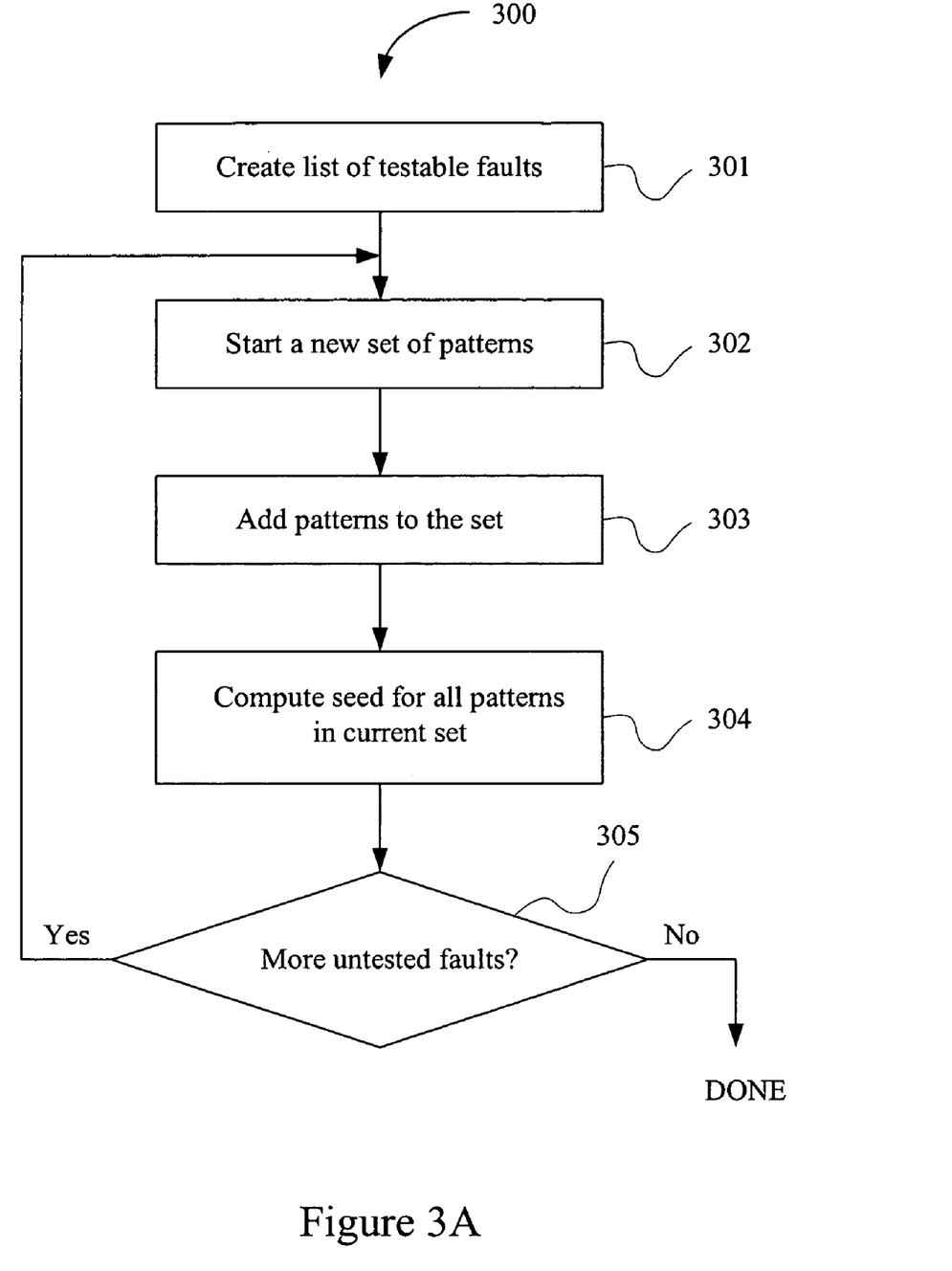
FIG. 3A illustrates a flow chart of a general test process that can be used in the embodiments of the present invention to compute seeds for detecting faults in a design.
Figure 3B:
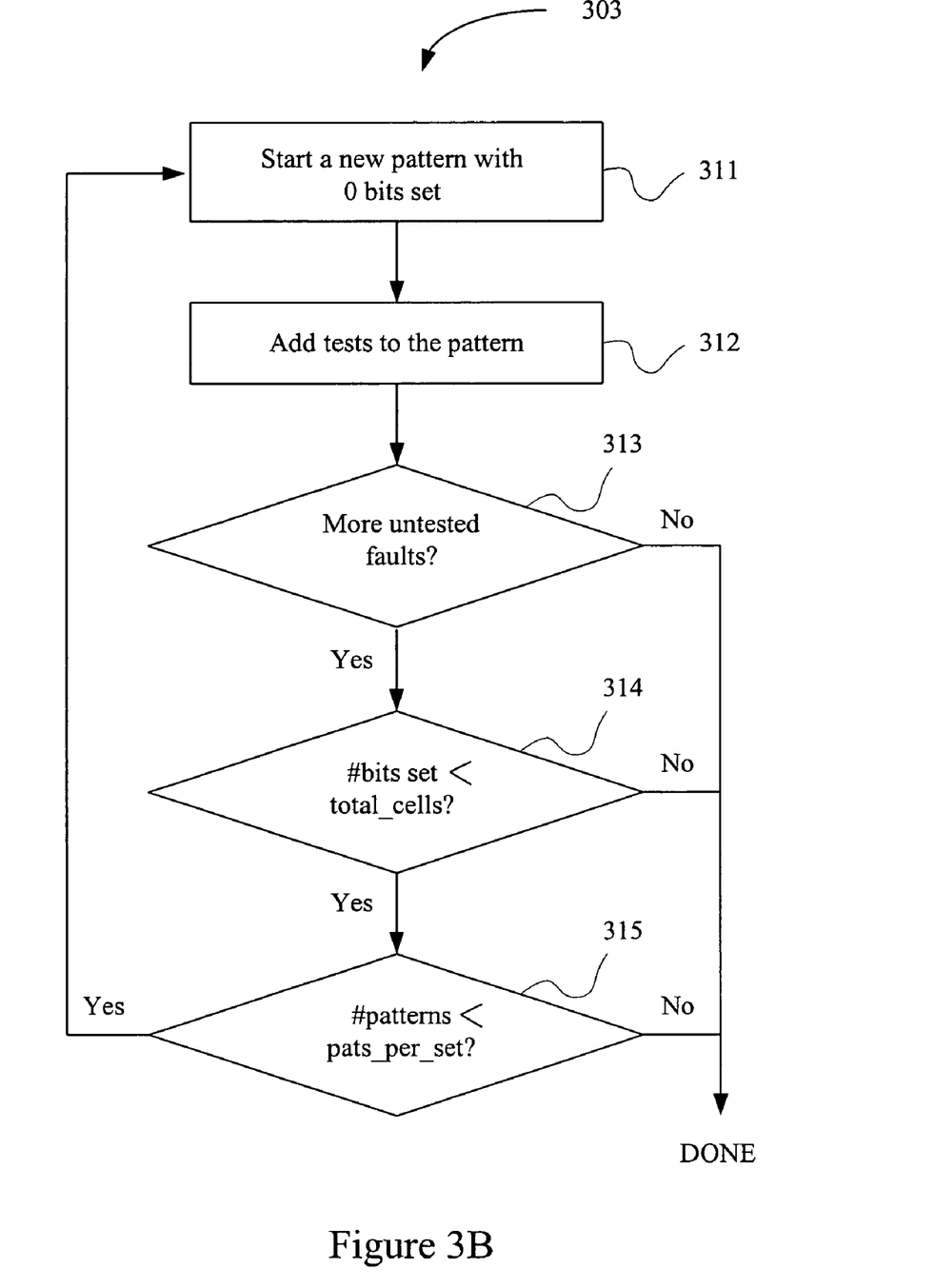
FIG. 3B illustrates a more detailed flow chart of the test process step of adding patterns to a seed.
Figure 3C:
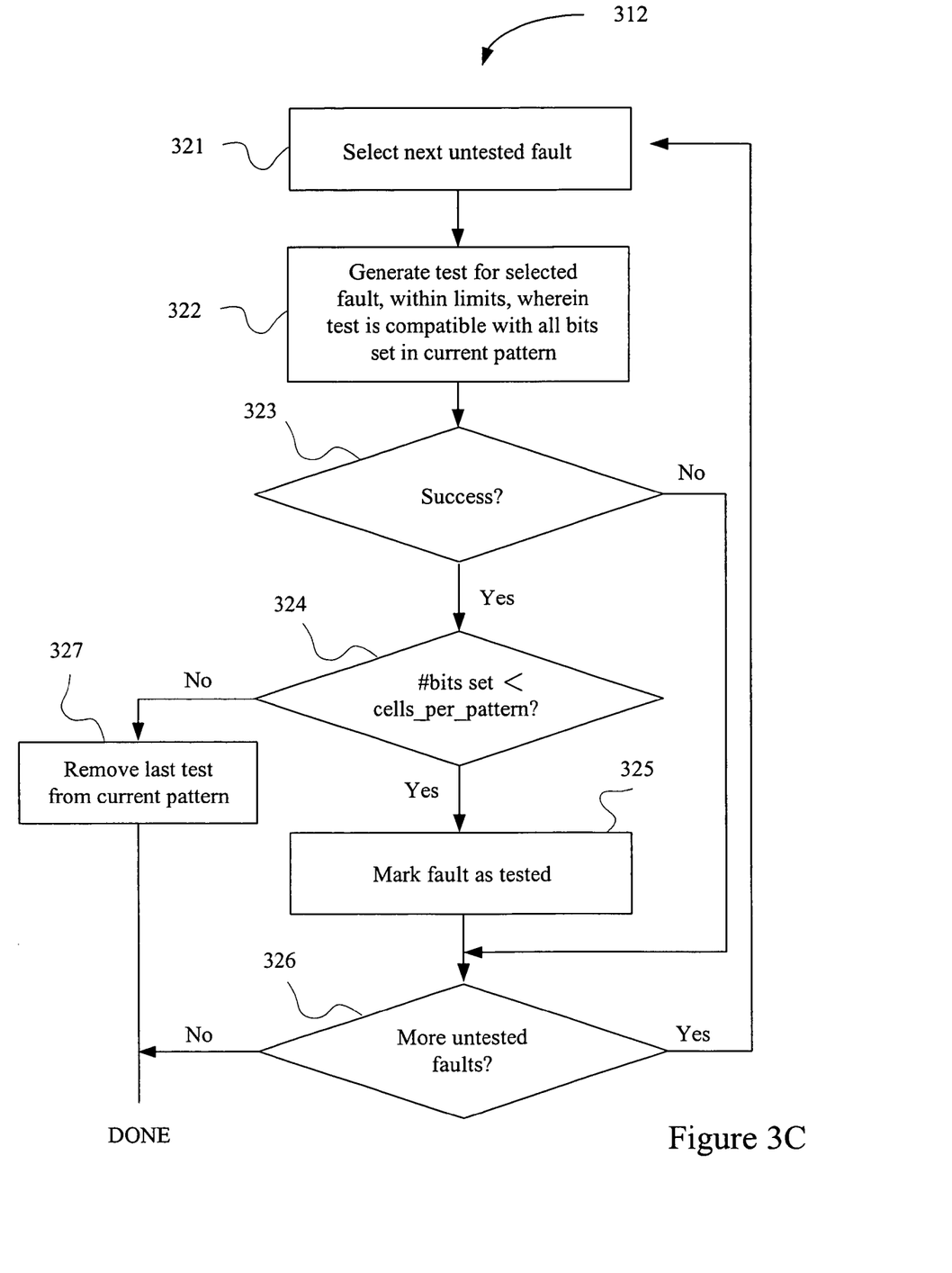
FIG. 3C illustrates a more detailed flow chart of the test process step of adding tests to a pattern.

FIGS. 3A–3C illustrate flow charts for generating a seed for multiple patterns in accordance with the present invention. FIG. 3A illustrates an overview of one seed generation process 300. In step 301, a list of testable faults can be created. A new set of patterns to test these faults can be started in step 302. Patterns are added to the set in step 303 as appropriate (explained in further detail below in reference to FIGS. 3B and 3C). At this point, a seed can be computed for the patterns in the current set in step 304. Finally, if more untested faults are present, as determined in step 305, then steps 302–305 are repeated until no untested faults are left.

Note that in standard deterministic ATPG, step 304 would be eliminated. In that methodology, standard deterministic ATPG would continues to add patterns to the set until all faults are tested. Thus, as described above, deterministic ATPG results in a large number of patterns, wherein each pattern is essentially a seed. In contrast, the present invention, which includes step 304, can provide multiple patterns per seed, thereby significantly reducing the required data storage. The mathematical equations for computing multiple patterns per seed are described in detail in the section herein entitled, "Calculating a Seed for a Set of Patterns".

Referring to FIG. 3B, which describes the step of adding patterns to the set (i.e. step 303), a new pattern can be started with no care bits set in step 311. In step 312, a new test for detecting a fault can be provided to the pattern (explained in further detail in reference to FIG. 3C). If there are remaining untested faults, as determined in step 313, then step 314 can be performed to determine whether the number of care bits set is less than a maximum number of scan cells that can be set for a single seed, total_cells. In a preferred embodiment, the length of PRPG-LFSR 210 minus ten is approximately equal to total_cells. In the embodiment described above, for a 256-bit LFSR, total_cells could be set to approximately 240. If the number of care bits set is less than total_cells, then step 315 can be performed to determine if the number of patterns is less than a predetermined number of patterns per set, pats_per_set, wherein a set includes a collection of patterns for which a seed is computed. In one embodiment, pats_per_set is used during the computation of the seed. See, Equations 3 of "Calculating a Seed for a Set of Patterns". If the number of patterns is less than pats_per_set, then steps 311–315 can be repeated until either no more untested faults are found (step 313), the number of care bits set is not less than total_cells (step 314), or the number of patterns is not less than pat_per_set (step 315), at which point the step of adding patterns to the set is complete.

Referring to FIG. 3C, which describes the step of adding a test to a pattern (i.e. step 312), the next untested fault can be selected in step 321. In step 322, a test for the selected fault, within limits, can be generated, wherein the test is compatible with all the care bits set in the current pattern. Note that under certain circumstances, a test cannot be generated that is compatible with the care bits already set in the pattern. Furthermore, even if computationally possible, generating the test may prove to be too time consuming. Therefore, in some embodiments, time limitations can be included to improve system performance. Thus, in step 322, the clause "within limits" can take into account computational impossibility and/or inefficiency. Step 323 determines whether the test has been successfully generated in view of these set limitations. If it is successful, then step 324 determines whether the number of care bits in the set is less than a set number of cells in the pattern, cells_per_pattern. This limitation is less than the value of total_cells and establishes a guide for the system of the embodiments of the present invention to give up trying to place additional tests within one pattern.

Typically, cells_per_pattern can be within a range of 10%–20% less than the value of total_cells. In the embodiment for the 256-bit LFSR, cells_per_pattern can be set to approximately 200 (240−(240×0.17)). Step 324 ensures that unnecessary time is not spent on the last 10%–20% of the faults that prove to be extremely difficult to generate associated tests compatible with the care bits set in the current pattern. In this manner, the embodiments of the present invention provide optimal performance of the test compression operation.

If the number of care bits set is less than cells_per_pattern, then the fault is marked as tested in step 325. If more untested faults are identified in step 326, then the process returns to step 321 to select the next untested fault. If all faults are tested, then step 312 is complete.

If the test for the selected fault cannot be generated in view of the set limitations, as determined in step 323, then the process proceeds directly to step 326, which determines whether more untested faults are identified. In this manner, maximum compression can be achieved by placing as many tests with compatible care bits into one pattern. As previously noted, this compression is limited by the value of cells_per_pattern in step 324, wherein if the number of care bits set is equal to or greater than cells_per_pattern, then that test is removed from the current pattern in step 327 and step 312 is complete.

Calculating a Seed for a Set of Patterns

In accordance with one feature of the present invention, a seed is computed for a set of ATPG-calculated patterns. Each pattern requires that certain scan cells be set to given values as provided by PRPG shadow 260 and PRPG-LFSR 210. Let $v_1$ be the initial state of PRPG-LFSR 210, i.e. the seed provided by PRPG shadow 260, and S be the n×n transition matrix of PRPG-LFSR 210 that implements a polynomial of degree n. The state of PRPG-LFSR 210 after k cycles can be written as:

$$v_{k+1} = v_1 S^k$$

Each of the m phase shifter outputs is a linear combination (XOR) of several PRPG-LFSR bits. The phase shifter can be described by the n×m matrix $$\Phi = [\phi_{ij}]$$

wherein $\phi_{ij}$ if input i is connected to the XOR function of output j; each column $\phi_j$ of the matrix represents an output j. Therefore, the outputs of the phase shifter (and inputs to the scan chains) after exactly k cycles can be described by the vector:

$$v_{\phi k+1} = v_{k+1} \Phi = v_1 S^k \Phi \qquad \text{(Equation 1)}$$

To satisfy all pattern requirements that certain scan cells be loaded to given values $\alpha_i$, the inputs of the scan chains must satisfy the equations:

$$V_{\phi_{k+1}} = [\alpha_1 \alpha_2 \ldots \alpha_m] = M_{\alpha\ k+1} \quad \text{(Equation 2)}$$

From Equations 1 and 2, $$v_1 S^k \Phi = M_{\alpha\ k+1} \quad \text{(Equation 3)}$$

$M_{\alpha\ k+1}$ contains values in each position and for each value of k that is calculated. The required bits in the plurality of scan cells of tested design 130 that are needed are filled in as 0's or 1's in their appropriate positions in $M'_{\alpha\ k+1}$ as shown below in Equation 3A. The other cells, which are not required, are not part of this equation and are left out.

$$\underline{v_1} S^k \Phi = M'_{\alpha\ k+1} \text{ for } k=0 \text{ to } h-1 \quad \text{(Equation 3A)}$$

The seed $v_1$ can be computed from the subset of Equation 3, i.e. Equation 3A, considering all values of k from 0 to h−1. To compute a seed for a single pattern, h is equal to the number of shifts to load scan chains 131–136. In one embodiment, to compute a seed for pats_per_set patterns, h is the product of the number of shifts to load scan chains 131–136 and pats_per_set, wherein the system of Equations 3 is assumed to comprise all care bits in the pats_per_set patterns.

For large n, m, and h, creating the system of Equations 3 can be more CPU-time consuming than solving the equations. Therefore, in accordance with one embodiment, the method of the embodiments of the present invention pre-calculates and stores data that can be used later to create, with minimal computation, an alternative system of equations. At that point, Gaussian elimination can be used to solve the equations. This method is based on the observation that any seed $v_1$ is a linear combination of the basis seeds:

$$\Gamma_1 = [10 \ldots 0]$$

$$\Gamma_2 = [01 \ldots 0]$$

$$\ldots$$

$$\Gamma_n = [00 \ldots 1]$$

so that $$v_1 = \sum_{i=1}^{n} \beta_i \Gamma_i \quad \text{(Equation 4)}$$

From Equations 3 and 4, $$\sum_{i=1}^{n} \beta_i \Gamma_i S^k \Phi = \quad \text{(Equation 5)}$$

$$\sum_{i=1}^{n} \beta_i (\Gamma_i S^k \Phi) = \sum_{i=1}^{n} \beta_i M_{i_{k+1}} = M_{\alpha_{k+1}} \text{ for } k = 0 \ldots h-1$$

wherein $M_{i\ k+1}$ is the k+1 row of the matrix $M_i$, and $M_{\alpha\ k+1}$ is the same as used in Equations 3 and 3A above. The h×m matrices $M_i$ are computed as follows: the PRPG-LFSR 210 is initialized with the basis seeds Γi, one at a time, and the end values loaded into scan chains 131–136 for each of the pats_per_set patterns are computed and stored. The pats_per_set bits are stored for each basis seed and for each scan cell. This pre-computation is done prior to the pattern set generation algorithm of FIGS. 3A–3C.

To compute a seed for the pattern set calculated in FIGS. 3A–3C, the pre-computed $M_i$ values are used to immediately create the system of Equations 5. These Equations 5 are much simpler than Equations 3A and are quickly solved through Gaussian elimination for $\beta_i$. But $\beta_i$ are exactly the coefficients of the desired seed $v_1$, as follows from Equation 4. Thus, seed computation in accordance with the embodiments of the present invention is very efficient and requires an insignificant amount of time in the flow of FIGS. 3A–3C.

Illustrative Implementations

In accordance with one embodiment of the present invention, PRPG shadow 260, PRPG-LFSR 210, phase-shifter 120, compactor 140, and MISR-LFSR 150 can be implemented as a single library element (e.g. the BIST controller library element). In another embodiment, this library element could also include the on-chip controller for providing the control signal to PRPG-LFSR 210 and the memory access for loading seeds into PRPG shadow 260. In yet another embodiment, PRPG shadow 260, PRPG-LFSR 210, phase-shifter 120, compactor 140, and MISR-LFSR 150 can be implemented g as separate library elements. In these embodiments, the library element(s) can be selected during the design process similar to any standard library element. In yet another embodiment, the design could be submitted to a third party, wherein the third party could build PRPG shadow 260, PRPG-LFSR 210, phase-shifter 120, compactor 140, and MISR-LFSR 150 out of standard library elements based on the submitted design.

Note that if the integrated circuit is a programmable logic device (PLD), then the BIST controller could be implemented using standard programmable resources on the PLD. Alternatively, in a PLD, the BIST controller could be implemented as a core (i.e. intellectual property (IP)), wherein the core could include a predetermined set of configuration bits that program the PLD to perform one or more functions. In another embodiment, a core could include source code or schematics, which describe the logic and connectivity of a design. Cores can be provided with an optimally floorplanned layout for specific PLDs. Cores can also be parameterizable, i.e. allowing the user to enter parameters to activate or change certain core functionality. Also note that the BIST controller, or any of its constituent parts, could be implemented in hard logic on the integrated circuit.

The methods described herein can be implemented using software, wherein the software can be stored on any type of appropriate media including a computer hard disk drive, a CDROM, or a server. In one embodiment, a computer running a set of instructions can interface with standard IC design software to ensure that test and pattern compression is optimized. In the computer-implemented embodiment, the software of the embodiments of the present invention can be run on a variety of computer platforms including: a PC using Windows 2000™ or NT™, 4.0 operating system with 128 MB of RAM and a 200 MHz Pentium Pro™ microprocessor, either stand alone or connected to a network, and a SUN™ workstation computer among others.

DBIST Provides Optimal Fault Coverage and Test Application Time

Providing deterministic ATPG patterns to the logic BIST structure of the invention (DBIST) significantly reduces test application time compared to both standard BIST systems and standard deterministic ATPG system. Specifically, as previously described above, loading seeds into a standard BIST system would require loading the PRPG in a serial manner. By using the PRPG shadow having multiple registers that load in parallel, the number of clock cycles can be dramatically reduced. For example, in the embodiments described herein, the standard BIST system would take 256 clock cycles, in addition to the 32 clock cycles required for loading the scan chains of the design, thereby resulting in a 256 clock cycle overhead. In contrast, the PRPG shadow would only take 32 clock cycles, which are fully overlapped with the 32 clock cycles required for loading the scan chains of the design, thereby resulting in no clock cycles overhead. Therefore, providing deterministic ATPG patterns to the logic BIST structure of the invention clearly reduces test application time compared to standard BIST systems.

In standard deterministic ATPG, because the test patterns are provided directly to the scan input pins and read from the scan output pins, this method can be severely limited by the number of pins provided for the IC. Specifically, to minimize test application time, the deterministic ATPG patterns are typically provided simultaneously to the scan input pins. Therefore, in light of the limited number of total pins available on the IC (e.g. 100 scan input and 100 scan output pins) and the desirability of placing all state elements in a scan chain, the resulting scan chains provided on the IC are relatively long.

Figure 4:
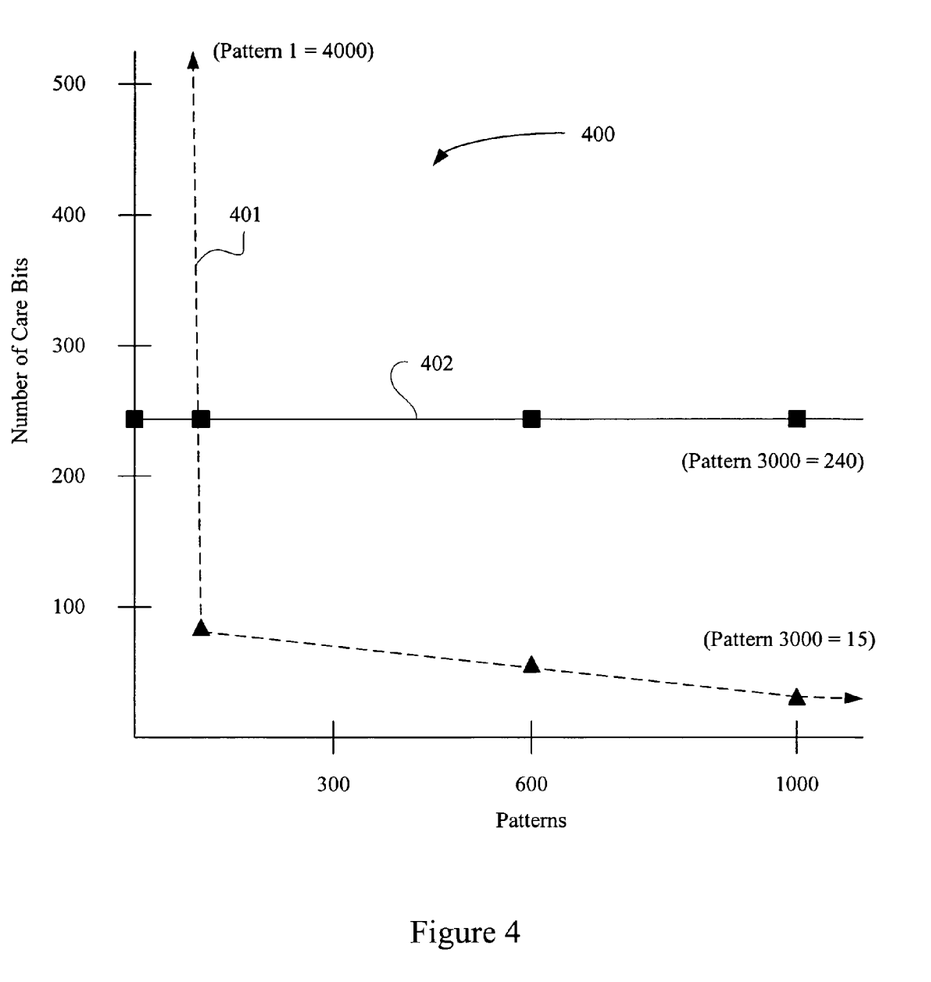
FIG. 4 illustrates a graph comparing the fault targeting efficiency of deterministic ATPG and deterministic BIST.

FIG. 4 illustrates a graph 400 plotting the number of care bits versus patterns. In graph 400, the dashed curve 401 represents the number of care bits that can be provided for each pattern using deterministic ATPG, whereas the solid line 402 represents the number of care bits that can be provided by the invention. Note that although the specific values can vary somewhat depending on the actual IC design or other factors, an analysis of various standard IC designs should yield comparable results to those shown in FIG. 4.

As known by those skilled in the art, deterministic ATPG is extremely efficient at utilizing care bits while targeting faults in its initial test patterns. For example, a first pattern might utilize up to 4000 care bits. However, after a relatively few number of patterns, the number of care bits that can be utilized is reduced dramatically. Thus, pattern 100 might only be able to utilize 60 care bits and pattern 600 might only be able to utilize 30 care bits. This progressively less efficient method can continue up to the last pattern, e.g. pattern 3000, which might utilize only 15 care bits.

In contrast, the invention can utilize a relatively constant number of care bits for every seed (see step 324 in FIG. 3C). In the embodiments described herein, up to approximately 240 care bits can be utilized assuming a 256-bit PRPG is provided. Thus, at some pattern close to pattern 100, the invention can actually utilize more care bits than standard deterministic ATPG. In fact, the invention can consistently utilize this number of care bits up to the last seed.

Of interest, using the invention, the number of patterns needed might be increased by a factor of two compared to standard deterministic ATPG. In other words, 6000 patterns would be used instead of 3000. However, because at least two patterns are placed in every seed, FIG. 4 is perhaps best appreciated by recognizing that line 402 can represent care bits utilized per seed of the invention.

Moreover, the logic BIST structure of the invention, i.e. including the PRPG and PRPG shadow, advantageously allows the design under test to be divided into many more scan chains compared to deterministic ATPG, e.g. 512 scan chains compared to 100 for deterministic ATPG. In other words, a scan chain in a logic BIST architecture could be five times shorter than a scan chain used in deterministic ATPG. Therefore, using the invention, the number of patterns might be increased by a factor of two, but every pattern can be applied in five times fewer clock cycles. Hence, the invention can actually reduce the test application time by a factor of two compared to deterministic ATPG.

Thus, in summary, the invention can provide fault coverage approaching 100% while significantly reducing the test application time compared to both logic BIST and deterministic ATPG.

OTHER EMBODIMENTS

Although illustrative embodiments of the invention have been described in detail herein with reference to the accompanying figures, it is to be understood that the invention is not limited to those precise embodiments. They are not intended to be exhaustive or to limit the invention to the precise forms disclosed. For example, although the pseudorandom pattern generator (PRPG) can be implemented using a linear feedback shift register (LFSR), other types of PRPGs can also be used in the present invention. For example, cellular automata can replace the PRPG-LFSR described herein. The cellular automata, like the PRPG-LFSR, includes a plurality of storage elements serially coupled and providing feedback to XOR functions. However, the cellular automata typically provides its feedback locally, e.g. to storage elements two or three elements to the right or left, whereas the PRPG-LFSR provides its feedback e globally, e.g. to storage elements at the other end of the register. In another example, the size of the PRPG shadow, PRPG-LFSR, or the scan chain can vary from one embodiment to another. In one case, the scan chain could include 256 bits. As seen from these illustrative examples, many modifications and variations will be apparent to practitioners skilled in this art. Accordingly, it is intended that the scope of the invention be defined by the following claims and their equivalents.

What is claimed is:

1. A built-in self-test (BIST) system for testing a design including a plurality of scan chains, the system comprising:
   a pseudorandom pattern generator (PRPG) shadow including a plurality of shadow registers, each shadow register including a plurality of first storage elements serially coupled;
   a PRPG circuit including a plurality of second storage elements operatively coupled, each second storage element selectively receiving one of a value of a corresponding first storage element, a value of another second storage element, and a value of a logic function, wherein the PRPG circuit generates a bit sequence for each of the scan chains; and
   a signature generator circuit coupled to receive output signals from the scan chains and generate a signature from the output signals.

2. The BIST system of claim 1, wherein a total number of first storage elements in the PRPG shadow is equal to a number of second storage elements.

3. The BIST system of claim 1, wherein a total number of first storage elements in each shadow register of the PRPG shadow is less than or equal to a total number of scan cells in each scan chain.

4. The BIST system of claim 1, wherein a first clock associated with the PRPG shadow and a second clock associated with the PRPG circuit are pulsed at the same time.

5. The BIST system of claim 1, wherein a first clock associated with the PRPG circuit and a second clock associated with the plurality of scan chains are pulsed at the same time.

6. The BIST system of claim 1, wherein the PRPG circuit includes a plurality of multiplexers, each multiplexer receiving a signal from a corresponding first storage element and providing a signal to a corresponding second storage element.

7. The BIST system of claim 6, wherein the multiplexers are set to transfer signals from the corresponding first storage elements using one control signal.

8. The BIST system of claim 1, wherein the PRPG circuit includes a linear feedback shift register (LFSR).

9. The BIST system of claim 1, further including a phase-shifter coupled between the PRPG circuit and the plurality of scan chains.

10. The BIST system of claim 1, wherein the signature generator circuit includes a multiple input signature register (MISR).

11. The BIST system of claim 10, wherein the signature generator circuit includes a compactor coupled between the plurality of scan chains and the MISR.

12. The BIST system of claim 10, wherein the MISR includes a linear feedback shift register.

13. A system for testing a design implemented in an integrated circuit (IC), the design including a plurality of scan chains, the system comprising:
a set of shadow registers, each shadow register including a plurality of storage elements serially coupled;
means for generating a pseudorandom pattern from values stored in the plurality of storage elements, the pseudorandom pattern being provided to the plurality of scan chains; and
means for providing a signature from output signals of the scan chains.

14. The system of claim 13, wherein each storage element in the shadow register has an associated storage element in the means for generating.

15. The system of claim 13, wherein a total number of storage elements in each shadow register is less than or equal to a total number of scan cells in each scan chain.

16. The system of claim 14, wherein the means for generating includes a plurality of switching devices, each switching device receiving a signal from a corresponding storage element in the shadow register and providing a signal to a corresponding associated storage element in the means for generating.

17. The system of claim 16, wherein the switching devices are set to transfer signals from the corresponding storage elements using one control signal.

18. The system of claim 13, wherein the means for generating includes a linear feedback shift register (LFSR).

19. The system of claim 13, further including means for phase shifting signals output from the means for generating, wherein the signals are then provided to the plurality of scan chains.

20. The system of claim 13, wherein the means for providing includes a multiple input signature register (MISR).

21. The system of claim 20, wherein the means for providing includes means for compacting output signals from the plurality of scan chains.

22. The system of claim 20, wherein the MISR includes a linear feedback shift register.

23. A pseudorandom pattern generator (PRPG) unit for testing a design including a plurality of scan chains, the PRPG unit comprising:
a PRPG shadow including a plurality of registers, each register including a plurality of first storage elements serially coupled; and
a PRPG circuit including a plurality of second storage elements operatively coupled, each second storage element selectively receiving one of a value of a corresponding first storage element, a value of another second storage element, and a value of a logic function, wherein the PRPG circuit generates a bit sequence for each of the scan chains.

24. The PRPG unit of claim 23, wherein each first storage element in the PRPG shadow has a corresponding second storage element in the PRPG circuit.

25. The PRPG unit of claim 23, wherein a total number of first storage elements in each register of the PRPG shadow is less than or equal to a total number of scan cells in each scan chain.

26. The PRPG unit of claim 23, wherein a first clock associated with the PRPG shadow and a second clock associated with the PRPG circuit are pulsed at the same time.

27. The PRPG unit of claim 23, wherein a first clock associated with the PRPG circuit and a second clock associated with the plurality of scan chains are pulsed at the same time.

28. The PRPG unit of claim 23, wherein the PRPG circuit includes a plurality of multiplexers, each multiplexer receiving a signal from a corresponding first storage element and providing a signal to a corresponding second storage element.

29. The PRPG unit of claim 28, wherein the multiplexers are set to transfer signals from the corresponding first storage elements using one control signal.

30. The PRPG unit of claim 23, wherein the PRPG circuit includes a linear feedback shift register (LFSR).

* * * * *